(12) United States Patent
Khodabandeh et al.

(10) Patent No.: US 9,356,591 B2
(45) Date of Patent: May 31, 2016

(54) CROSSPOINT SWITCH WITH SEPARATE VOLTAGE SOURCES FOR INPUT AND OUTPUT PORTS

(75) Inventors: Poupak Khodabandeh, Laguna Beach, CA (US); Merrick Brownlee, Hillsboro, OR (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 1089 days.

(21) Appl. No.: 13/437,629

(22) Filed: Apr. 2, 2012

(65) Prior Publication Data

US 2012/0262219 A1    Oct. 18, 2012

Related U.S. Application Data

(60) Provisional application No. 61/471,540, filed on Apr. 4, 2011.

(51) Int. Cl.
*H03K 17/00* (2006.01)
*H03K 17/693* (2006.01)
*H04L 12/933* (2013.01)
*G06F 13/40* (2006.01)

(52) U.S. Cl.
CPC ............ *H03K 17/002* (2013.01); *H03K 17/693* (2013.01); *H04L 49/101* (2013.01); *G06F 13/4022* (2013.01)

(58) Field of Classification Search
None
See application file for complete search history.

(56) References Cited

U.S. PATENT DOCUMENTS

| | | | | |
|---|---|---|---|---|
| 4,818,988 A * | 4/1989 | Cooperman | ........... | H04Q 3/521 327/404 |
| 6,580,359 B1 * | 6/2003 | Tam | ...... | H03K 17/005 326/27 |
| 6,771,162 B1 * | 8/2004 | Moss | ................... | H03K 17/002 340/14.62 |
| 6,900,998 B2 * | 5/2005 | Erickson | ............... | H02M 5/297 290/44 |
| 2003/0085718 A1 * | 5/2003 | Guiraud | ............... | H03K 17/603 324/631 |
| 2011/0277010 A1 * | 11/2011 | Paul | ......................... | H04B 3/06 725/149 |

* cited by examiner

*Primary Examiner* — Mohamed Barakat (57) ABSTRACT

A crosspoint switch device has a plurality of input ports each connected to a respective voltage source and a plurality of output ports each connected to a respective voltage source. A switch array selectively provides signal paths between the input ports and the output ports. The voltage sources are separate from one another.

2 Claims, 7 Drawing Sheets

CROSSPOINT SWITCH WITH SEPARATE VOLTAGE SOURCES FOR INPUT AND OUTPUT PORTS

This application claims priority to U.S. Provisional Patent Application No. 61/471,540 filed Apr. 4, 2011, entitled CROSSPOINT SWITCH WITH SEPARATE VOLTAGE SOURCES FOR INPUT AND OUTPUT PORTS, the disclosure of which is hereby incorporated by reference in its entirety.

TECHNICAL FIELD

The invention relates generally to integrated circuits, and more particularly to a crosspoint switch with separate voltage sources for input and output ports.

BACKGROUND

Figure 1:
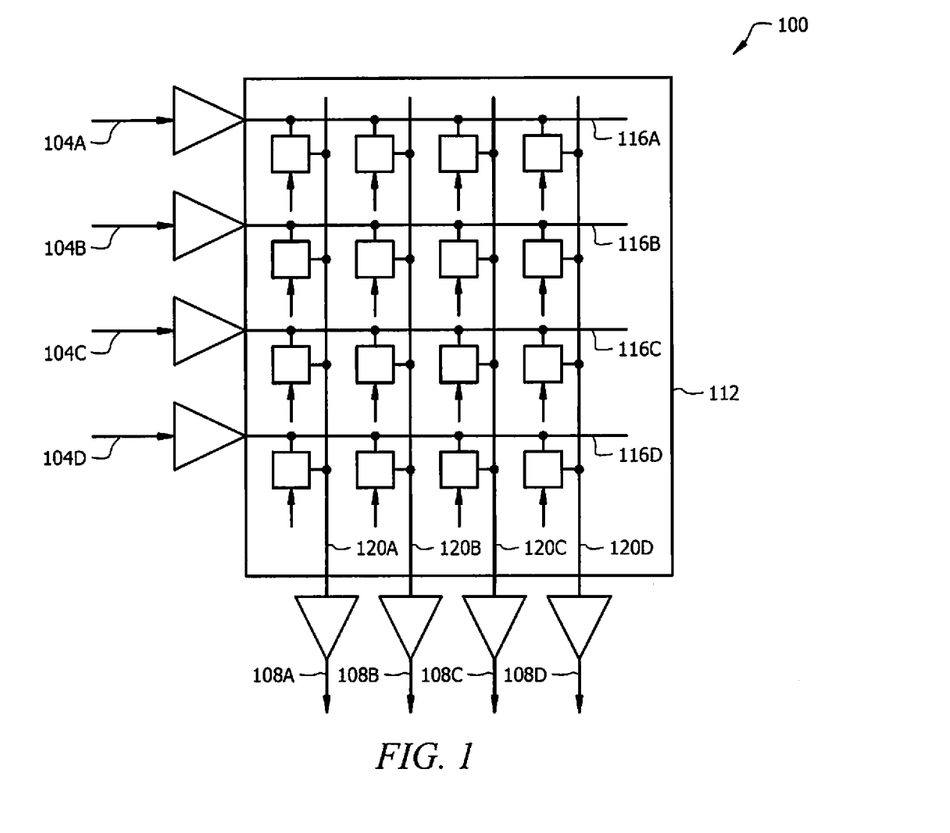
FIG. 1 illustrates an existing 4×4 crosspoint switch including four input ports and four output ports.

Crosspoint switches are used to route signals from a plurality of inputs to a plurality of outputs. FIG. 1 illustrates an existing 4×4 crosspoint switch 100 that has four input ports 104A-104D and four output ports 108A-108D. The crosspoint switch 100 includes a switch array 112 for selectively providing signal paths between the input ports 104A-104D and the output ports 108A-108D. The switch array 112 includes four rows and four columns of switches 112. Each of input lines 116A-116D links the output of one of the input ports 104A-104D to a separate row of the switches 112. Each of output lines 120A-120D links a separate column of the switches 112 to an input of one of the output ports 108A-108D. Each switch 112 can selectively provide a signal path between one of the input lines 116A-116D and one of the output lines 120A-120D.

Figure 2:
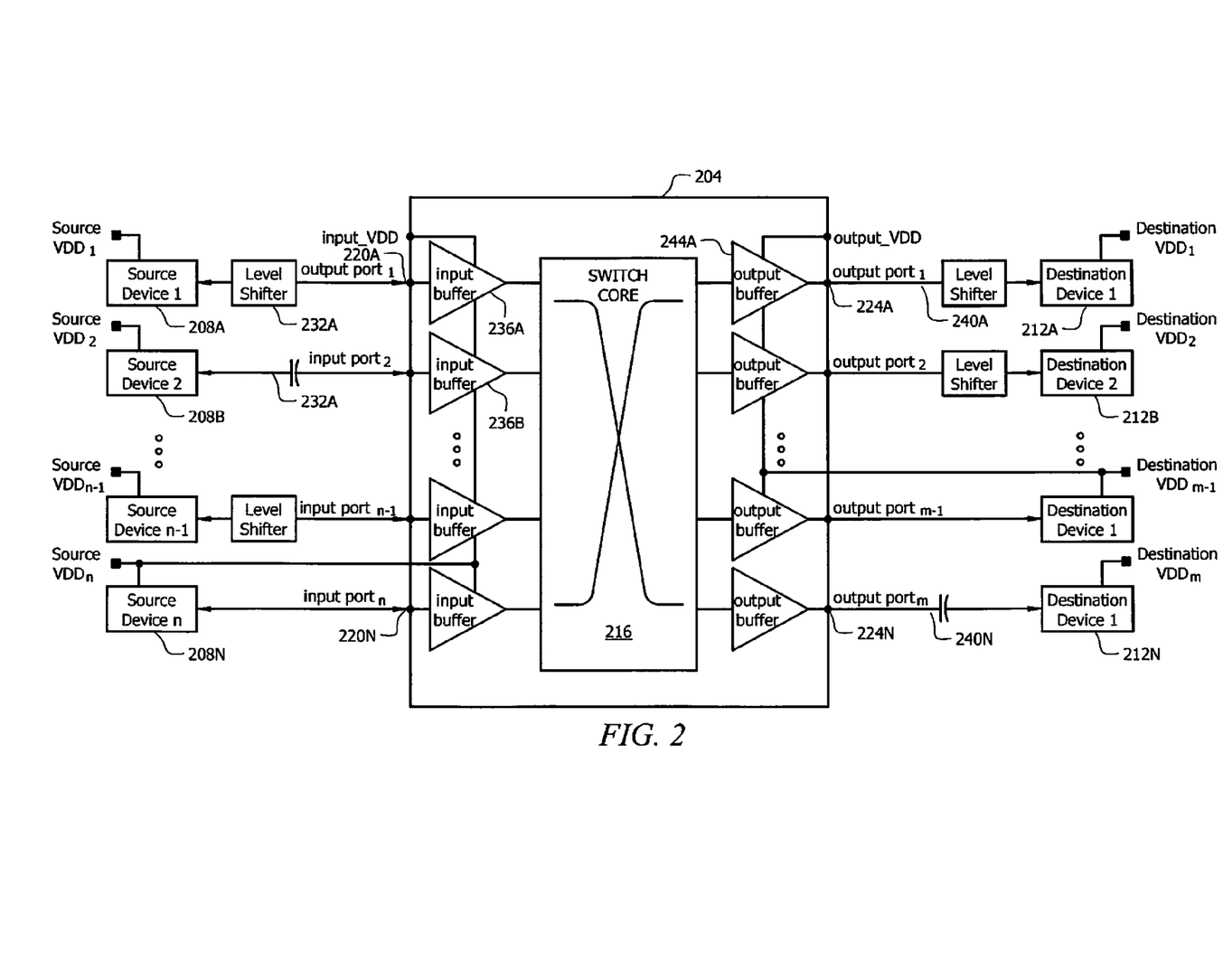
FIG. 2 illustrates an existing crosspoint switch that routes data from a plurality of source devices to a plurality of destination devices.

FIG. 2 illustrates an existing crosspoint switch 204 that routes signals from a plurality of source devices 208A-208N to a plurality of destination devices 212A-212N. The crosspoint switch 204 includes a switch array 216 for selectively providing signal paths between input ports 220A-220N and output ports 224A-224N. Each one of the source devices 208A-208N is connected to the switch array 216 via one of the input ports 220A-220N. Likewise, each one of the destination devices 212A-212N is connected to the switch array 216 via one of the output ports 224A-224N.

It will be appreciated that the source devices 208A-208N and the destination devices 212A-212N may not necessarily be connected to a same voltage source. For example, some of the source devices may be connected to a 1.8V source while the remaining source devices may be connected to a 3.3V source. Likewise, some of the destination devices may be connected to a 1.5V source while the other destination devices may be connected to a 2.5V source.

In existing crosspoint switches, the input ports receive power from a single voltage source. Referring again to FIG. 2, the input ports 220A-220N receive power from a voltage source Input_VDD. Because the input ports 220A-220N all receive power from a single voltage source, it is possible to match the input ports 220A-220N to only one of the different voltage sources connected to the source devices, but not all. Similarly, the output ports 224A-224N receive power from a single voltage source Output_VDD. Thus, it is possible to match the output ports 224A-224N to only one of the different voltage sources connected to the destination devices, but not all.

In order to connect the crosspoint switch 204 to a plurality of devices powered by different voltage sources, level shifters and buffers are generally used. Referring again to FIG. 2, the source device 208A is connected to a voltage source VDD 1. However, the input port 220A is connected to the voltage source Input_VDD. Since the source device 208A and the input port 220A are connected to different voltage sources, a level shifter 232A and a buffer 236A are connected in series to enable the source device 208A to connect to the crosspoint switch 216. Alternatively, an AC coupling capacitor may be used to facilitate such connections. For example, the source device 208B is linked to the crosspoint switch 216 via an AC coupling capacitor 232B and a buffer 236B.

Referring again to FIG. 2, the destination device 212A is linked to the switch 216 via a level shifter 240A and a buffer 244A that are connected in series. On the other hand, the destination device 212N is linked to the switch 216 via a coupling capacitor 240N and a buffer 244N. The use of level shifters and buffers increases the cost and complexity of a system. The use of AC coupling capacitors also increases complexity of a system and causes impedance discontinuities on a circuit board, resulting in signal degradation. The cost and complexities associated with utilizing AC coupling capacitors and level shifters can be avoided by DC coupling. However, in order to DC couple the input and output ports of the crosspoint switch to the source devices, the input and output ports of the crosspoint switch must be supplied from the same voltage source as the source devices.

SUMMARY

An embodiment of the present invention provides a crosspoint switch device for routing signals. The crosspoint switch device includes a plurality of input ports each connected to a respective voltage source. The crosspoint switch device also includes a plurality of output ports each connected to a respective voltage source. The crosspoint switch device also includes a switch array for selectively providing signal paths between the plurality of input ports and the output ports. The voltage sources are separate from one another.

Another embodiment of the present invention provides a crosspoint switch device including at least two sets of input ports. Each set of input ports includes at least two input ports, and each set of input ports is connected to a respective voltage source. The crosspoint switch device also includes at least two sets of output ports. Each set of output ports includes at least two output ports, and each set of output ports is connected to a respective voltage source. The crosspoint switch device also includes a switch array for selectively providing signal paths between the plurality of input ports and the output ports. The voltage sources are separate from one another.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 3:
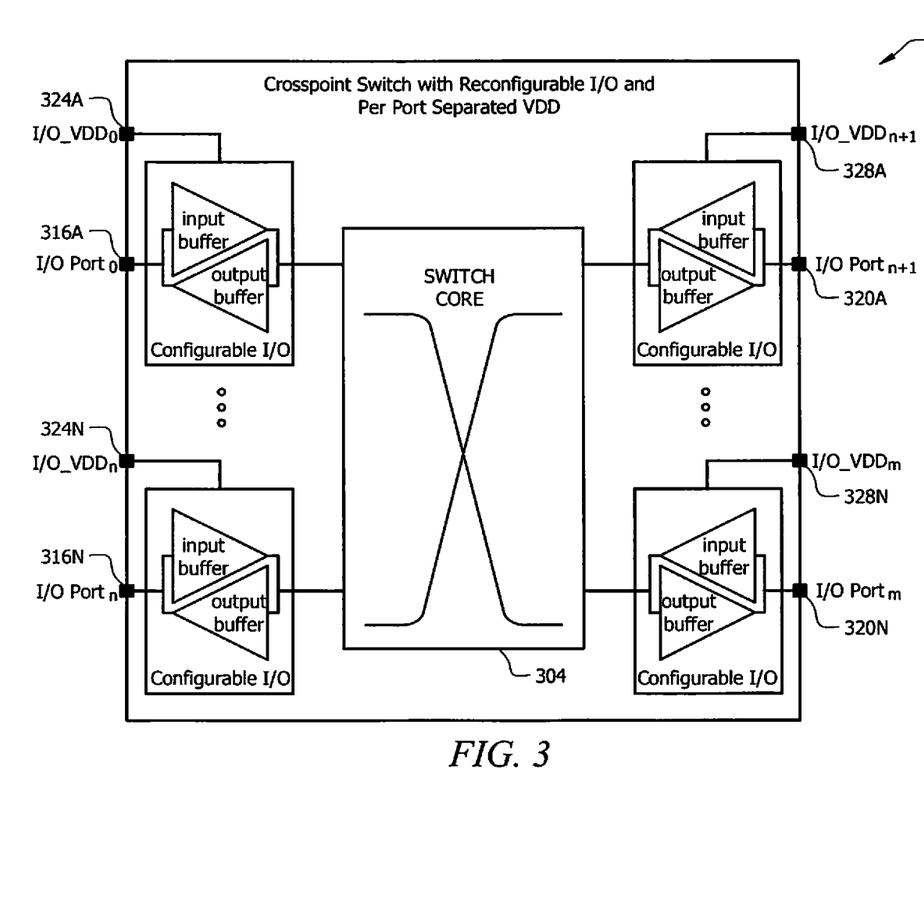
FIG. 3 illustrates a crosspoint switch in accordance with one embodiment of the invention.

FIG. 3 illustrates a crosspoint switch 300 in accordance with one embodiment of the invention. The crosspoint switch 300 routes data from a plurality of source devices to a plurality of destination devices (source and destination devices not shown in FIG. 3). The crosspoint switch 300 includes a switch array 304 for selectively providing signal paths between reconfigurable input/output (I/O) ports 316A-316N and reconfigurable input/output (I/O) ports 320A-320N. The reconfigurable I/O ports can each be configured to operate as an input port or as an output port. The reconfigurable I/O ports 316A-316N and 320A-320N are each connected to a separate voltage source. The reconfigurable I/O port 316A is connected to a voltage source 324A. The reconfigurable I/O port 316N is connected to a voltage source 324N. The reconfigurable I/O port 320A is connected to a voltage source 328A and the reconfigurable I/O port 320N is connected to a voltage source 328N.

The voltage sources 324A-324N, 328A-328N are separate from one another. In other words, the voltage sources 324A-324N, 328A-328N each may have a different voltage level. For example, the voltage source 324A may supply 1.2V, the voltage source 324N may supply 1.8V, the voltage source 328A may supply 2.5V while the voltage source 328N may supply 3.3V. By separating the voltage sources, an I/O port can be powered by the same voltage source that powers the source or destination device to which the I/O port connects. For example, if the source device connected to the I/O port 316A is supplied from a 1.2V source, the I/O port 316A can be connected to the same 1.2V source. Similarly, if the destination device connected to the I/O port 320A is supplied from a 2.5V source, the I/O port 320A can be connected to the same 2.5V source. Thus, by connecting each I/O port to the same voltage source connected to the source or destination device to which the I/O port connects, the need for level shifters and AC coupling capacitors is eliminated and consequently, a connection can be DC coupled.

Figure 4:
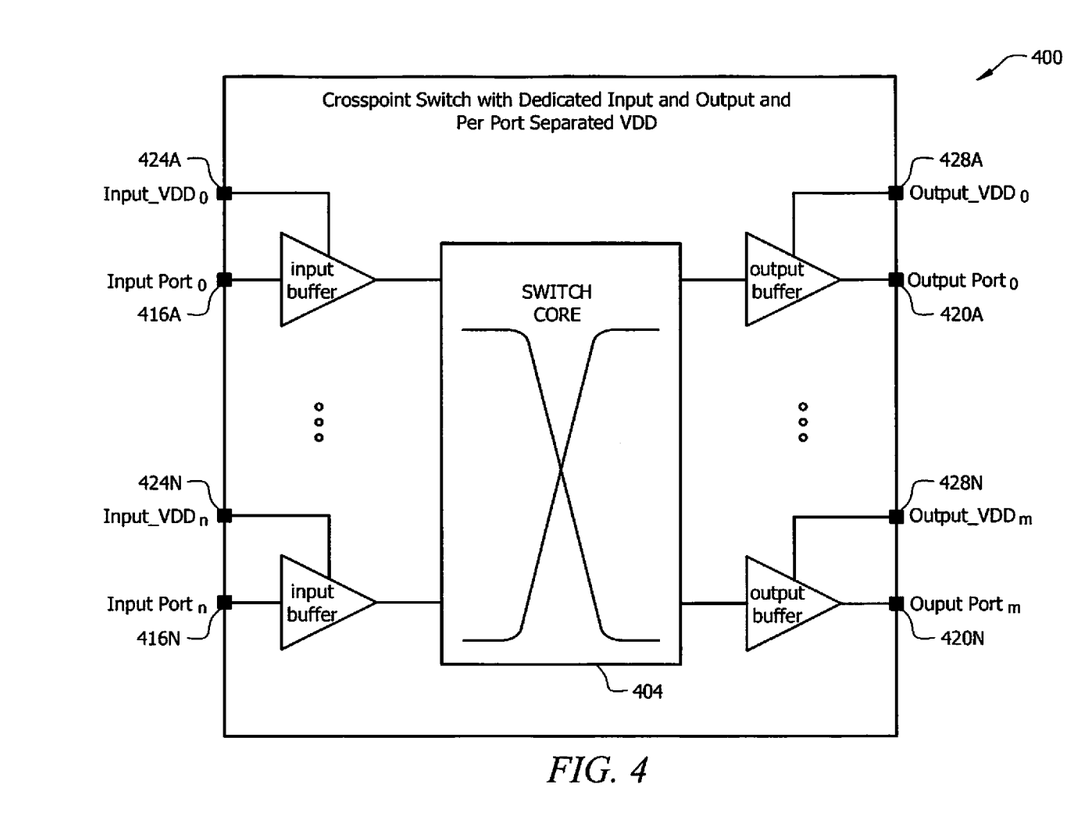
FIG. 4 illustrates a crosspoint switch in accordance with another embodiment of the invention.

FIG. 4 illustrates a crosspoint switch 400 in accordance with another embodiment of the invention. The crosspoint switch 400 routes data from a plurality of source devices to a plurality of destination devices (source and destination devices not shown in FIG. 4). The crosspoint switch 400 includes a switch array 404 for selectively providing signal paths between dedicated input ports 416A-416N and dedicated output ports 420A-420N. The ports 416A-416N and 420A-420N are each connected to a separate voltage source. The input port 416A is connected to a voltage source 424A. The input port 416N is connected to a voltage source 424N. The output port 420A is connected to a voltage source 428A and the output port 420N is connected to a voltage source 428N. The voltage sources 424A-424N, 428A-428N are separate from one another. In other words, the voltage sources 424A-424N, 428A-428N each may have a different voltage level. For example, the voltage source 424A may supply 1.2V, the voltage source 424N may supply 1.8V, the voltage source 428A may supply 2.5V while the voltage source 428N may supply 3.3V.

Figure 5:
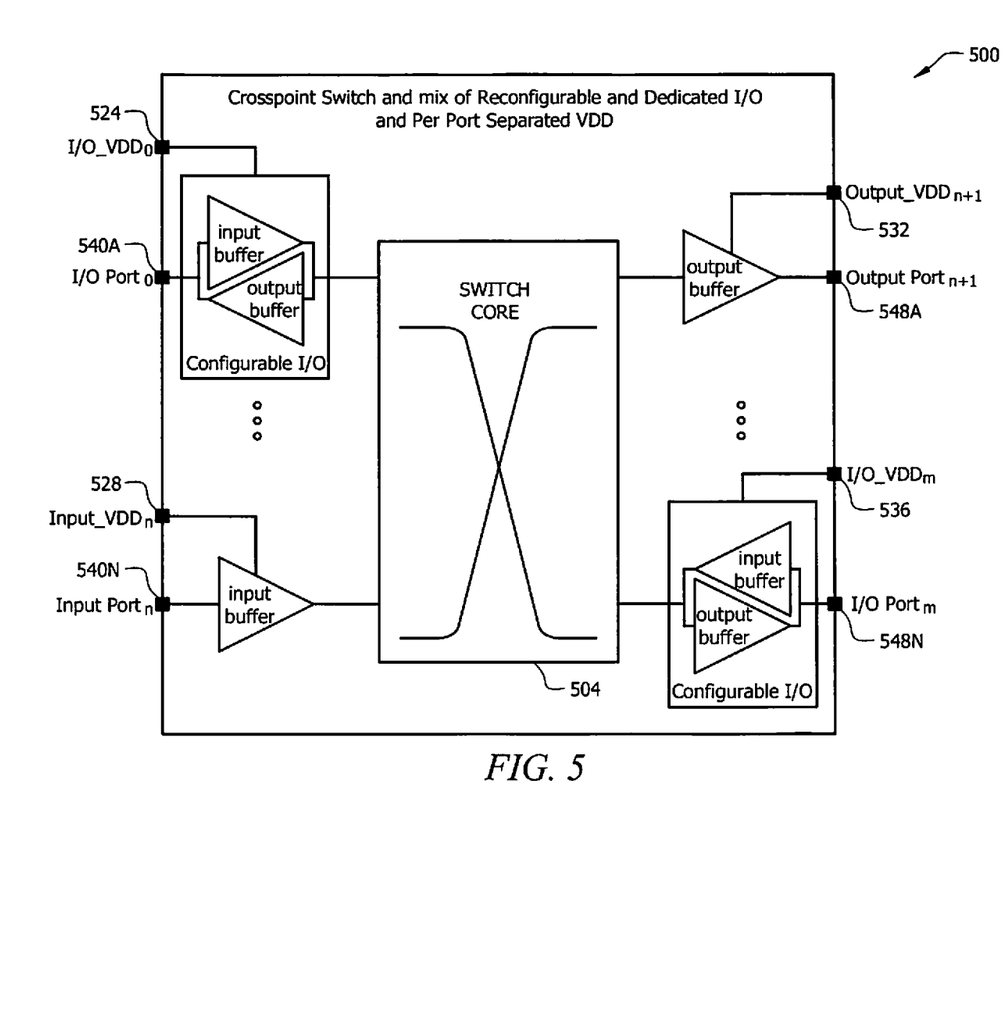
FIG. 5 illustrates a crosspoint switch in accordance with yet another embodiment of the invention

FIG. 5 illustrates a crosspoint switch 500 in accordance with yet another embodiment of the invention. The crosspoint switch 500 routes data from a plurality of source devices to a plurality of destination devices (source and destination devices not shown in FIG. 5). The crosspoint switch 500 includes a switch array 504 for selectively providing signal paths between a combination of reconfigurable I/O ports and dedicated input ports 540A-540N and a combination of reconfigurable I/O ports and dedicated output ports 548A-548N. The ports 540A-540N and 548A-548N are each connected to a separate voltage source. The reconfigurable I/O port 540A is connected to a voltage source 524. The dedicated input port 540N is connected to a voltage source 528. The dedicated output port 548A is connected to a voltage source 532, and the reconfigurable I/O port 548N is connected to a voltage source 536. The voltage sources 524, 528, 532 and 536 are separate from one another. In other words, the voltage sources 524, 528, 532 and 536 each may have a different voltage level.

Figure 6:
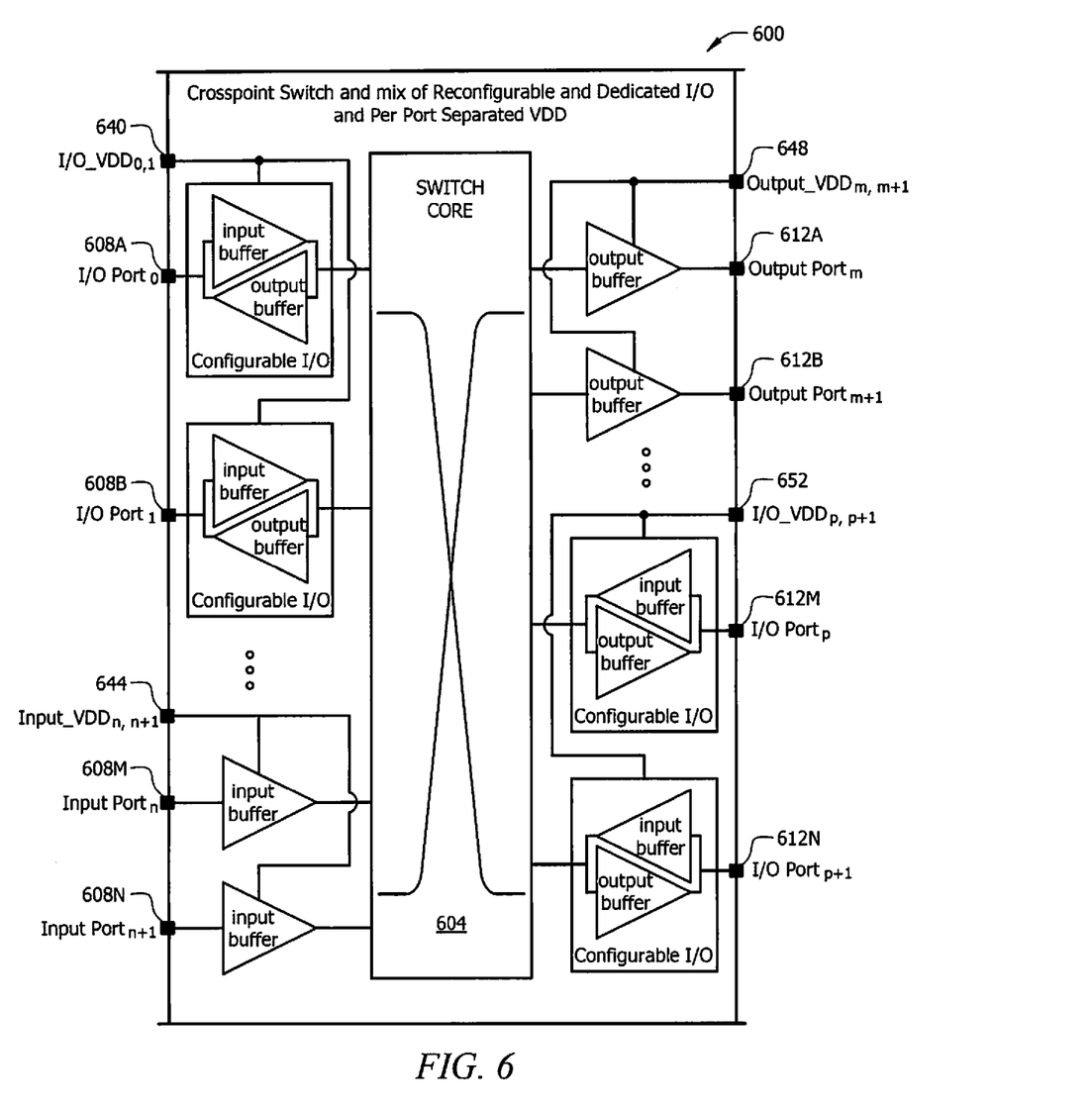
FIG. 6 illustrates a crosspoint switch in accordance with yet another embodiment of the invention.

FIG. 6 illustrates a crosspoint switch 600 in accordance with yet another embodiment of the invention. The crosspoint switch 600 includes a switch array 604 for selectively providing signal paths between a combination of reconfigurable I/O ports and dedicated input ports 608A-608N and a combination of reconfigurable I/O ports and dedicated output ports 612A-612N. A separate voltage source is used to power a pair of ports. The reconfigurable I/O ports 608A and 608B are connected to a voltage source 640. The dedicated input ports 608M and 608N are connected to a voltage source 644. The dedicated output ports 612A and 612B are connected to a voltage source 524. The reconfigurable I/O ports 612M and 612N are connected to a voltage source 652. The voltage sources 640, 644, 648 and 652 are separate from one another. In other words, the voltage sources 640, 644, 648 and 652 each may have a different voltage level.

Figure 7:
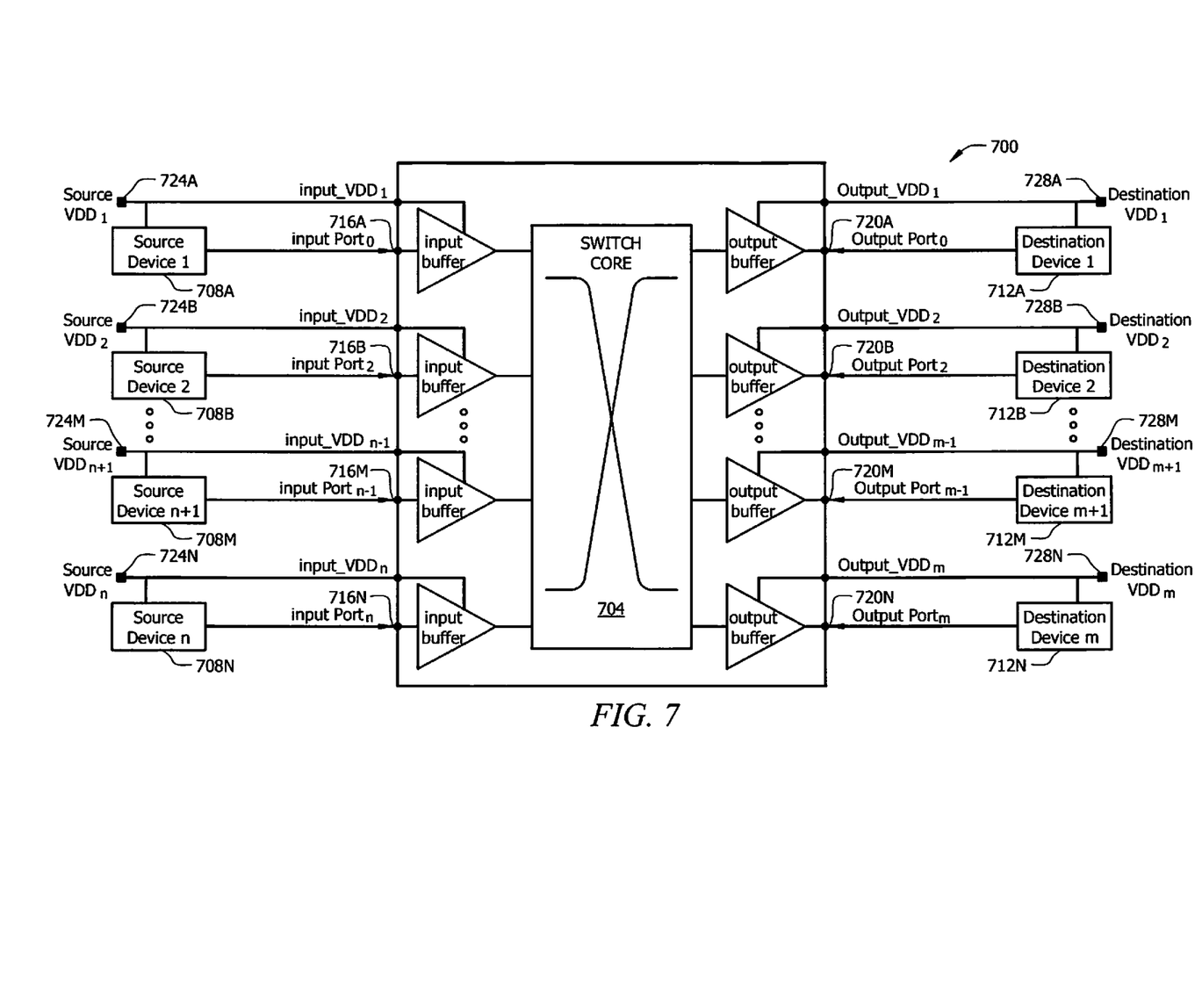
FIG. 7 illustrates an application of a crosspoint switch 700 with per port separated input and output voltage sources.

FIG. 7 illustrates an application of a crosspoint switch 700 with per port separated input and output voltage sources. Source devices 708A-708N each connects to a switch array 704 via one of input ports 716A-716N. Accordingly, both the source device 708A and the input port 716A receive power from a voltage source 724A. Thus, the source device 708A and the input port 716A to which the source device 708A connects to receive power from the same voltage source. Destination devices 712A-712N each connects to one of output ports 720A-720N. Accordingly, both the destination device 712A and the output port 720A receive power from a voltage source 728A. Thus, the destination device 712A and the output port 720A to which the destination device 712A connects to receive power from the same voltage source.

It will be apparent that the foregoing disclosure can be expanded to any combination of dedicated input and output ports and reconfigurable I/O ports. The various embodiments disclosed herein eliminate the need for level shifters and AC coupling capacitors. As a result, overall cost of a system is reduced and at the same time signal integrity is improved.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered obvious and desirable by those skilled in the art based upon a review of the foregoing description of embodiments. Accordingly, it is appropriate that the appended claims be construed broadly and in a manner consistent with the scope of the invention.

The invention claimed is:

1. A crosspoint switch device, comprising:
a plurality of input ports each connected to one of a plurality of signal sources, and a respective voltage source to which is connected the same signal source;
a plurality of output ports each connected to one of a plurality of receiving devices, and a respective voltage source to which is connected the same receiving device; and
a switch array for routing signals from the plurality of signal sources to the plurality of receiving devices by selectively providing signal paths between the input ports and the output ports, wherein the voltage sources each generate a different voltage value.

2. A system for routing signals, comprising:
a plurality of signal sources each connected to a respective voltage source;
a plurality of receiving devices each connected to a respective voltage source, wherein the voltage sources are separate from one another;
a crosspoint switch device comprising:
a plurality of input ports each connected to one of the signal sources and connected to the voltage source to which is connected the same signal source;
a plurality of output ports each connected to one of the receiving devices and connected to the voltage source to which is connected the same receiving device; and
a switch array for routing signals from the plurality of signal sources to the plurality of receiving devices by selectively providing signal paths between the input ports and the output ports, wherein the voltage sources each generate a different voltage value.

* * * * *